(12) United States Patent
Hayashi et al.

(10) Patent No.: US 8,076,736 B2
(45) Date of Patent: Dec. 13, 2011

(54) SEMICONDUCTOR DEVICE AND METHOD FOR MANUFACTURING THE SAME

(75) Inventors: Masashi Hayashi, Hyogo (JP); Shin Hashimoto, Osaka (JP)

(73) Assignee: Panasonic Corporation, Osaka (JP)

( * ) Notice: Subject to any disclaimer, the term of this patent is extended or adjusted under 35 U.S.C. 154(b) by 128 days.

(21) Appl. No.: 12/518,124

(22) PCT Filed: Feb. 12, 2008

(86) PCT No.: PCT/JP2008/000202
§ 371 (c)(1),
(2), (4) Date: Jun. 8, 2009

(87) PCT Pub. No.: WO2008/099597
PCT Pub. Date: Aug. 21, 2008

(65) Prior Publication Data
US 2010/0244048 A1 Sep. 30, 2010

(30) Foreign Application Priority Data
Feb. 14, 2007 (JP) .................................. 2007-033617

(51) Int. Cl.
*H01L 29/78* (2006.01)
(52) U.S. Cl. ........ 257/413; 257/335; 257/336; 257/337; 257/338; 257/339; 257/77; 257/E29.255
(58) Field of Classification Search .......... 257/335–349, 257/77, 413, E29.104, E29.255
See application file for complete search history.

(56) References Cited

U.S. PATENT DOCUMENTS
| | | | |
|---|---|---|---|
| 4,990,994 A | 2/1991 | Furukawa et al. | |
| 5,939,753 A * | 8/1999 | Ma et al. | 257/339 |
| 2004/0183080 A1 * | 9/2004 | Kusumoto et al. | 257/77 |
| 2005/0067661 A1 | 3/2005 | Choi | |
| 2005/0118757 A1 | 6/2005 | Cabral, Jr. et al. | |
| 2006/0205195 A1 | 9/2006 | Malhan et al. | |
| 2007/0045631 A1 * | 3/2007 | Endo et al. | 257/77 |
| 2008/0054246 A1 * | 3/2008 | Sato | 257/4 |

FOREIGN PATENT DOCUMENTS
| | | |
|---|---|---|
| JP | 62-71271 | 4/1987 |
| JP | 05-55569 | 3/1993 |
| JP | 07-99169 | 4/1995 |
| JP | 2000-200902 | 7/2000 |
| JP | 2002-16017 | 1/2002 |
| JP | 2002-75909 | 3/2002 |
| JP | 2003-243323 | 8/2003 |
| JP | 2005-277240 | 10/2005 |
| JP | 2006-261624 | 9/2006 |

OTHER PUBLICATIONS

International Search Report for corresponding application No. PCT/JP2008/000202 completed Apr. 23, 2008.

* cited by examiner

*Primary Examiner* — Cuong Q Nguyen
*Assistant Examiner* — Tran Tran
(74) *Attorney, Agent, or Firm* — Renner, Otto, Boisselle & Sklar, LLP

(57) ABSTRACT

A semiconductor device according to the present invention comprises a silicon carbide semiconductor substrate (1) including a silicon carbide layer (2); a high-concentration impurity region (4) provided in the silicon carbide layer (2); an ohmic electrode (9) electrically connected with the high-concentration impurity region (4); a channel region electrically connected with the high-concentration impurity region; a gate insulating layer (14) provided on the channel region; and a gate electrode (7) provided on the gate insulating layer (14). The ohmic electrode (9) contains an alloy of titanium, silicon and carbon, and the gate electrode (7) contains titanium silicide.

15 Claims, 8 Drawing Sheets

(a)

(b)

(c)

(a)

(b)

(c)

(d)

SEMICONDUCTOR DEVICE AND METHOD FOR MANUFACTURING THE SAME

TECHNICAL FIELD

The present invention relates to a semiconductor device including a silicon carbide semiconductor substrate, and in particular to a semiconductor device including a silicon carbide semiconductor substrate having an ohmic electrode and a gate electrode and a method for producing the same.

BACKGROUND ART

Conventionally, power devices using silicon (Si) semiconductors have been used as devices for power electronics. Devices for power electronics are desired to operate at a higher frequency with a larger current. Various studies for research and development have been made to improve the performance of silicon power devices.

However, the performance of the silicon power devices is now approaching the theoretical limit thereof. In addition, power devices are occasionally required to operate in severe environments, for example, at a high temperature or under radiation. Silicon semiconductors are not suitable to use in such severe environments. For these reasons, studies are being made regarding devices using semiconductor materials other than silicon.

Among various semiconductor materials, a silicon carbide (SiC) semiconductor has a large forbidden band width (3.26 eV in the case of type 4H) and is superb in electric conduction control and radiation resistance at high temperature. The silicon carbide semiconductor has a breakdown field which is about one digit higher than that of silicon and also has a saturation drift speed of electrons which is about twice as high as that of silicon, and so has a high withstand voltage and is controllable at a high frequency with a large power. Owing to these physical properties thereof as a semiconductor material, silicon carbide is anticipated as a semiconductor material for power devices operable at a higher frequency with a larger current.

For forming a device such as a MISFET or the like using silicon carbide, nickel (Ni) is widely used as an ohmic electrode material for n-type silicon carbide. However, where nickel is merely deposited on n-type silicon carbide by vacuum vapor deposition or the like, the interface between nickel and n-type silicon carbide exhibits a rectifying function but does not exhibit any ohmic function because a Schottky barrier is formed at the interface between the metal and the semiconductor. Usually, an ohmic electrode can only be obtained by performing thermal treatment on nickel, after being deposited, at a high temperature to promote diffusion of nickel into silicon carbide and diffusion of silicon in the silicon carbide into nickel. Semiconductor devices including an ohmic electrode formed of nickel provided on an n-type silicon carbide semiconductor are disclosed in, for example, Patent Documents 1 and 2.

Patent Document 1: Japanese Laid-Open Patent Publication No. 7-99169

Patent Document 2: Japanese Laid-Open Patent Publication No. 2003-243323

DISCLOSURE OF THE INVENTION

Problems to be Solved by the Invention

FIG. 13 schematically shows a part of a structure of a conventional silicon carbide semiconductor device having an ohmic electrode. As shown in FIG. 13, the conventional silicon carbide semiconductor device includes a low-resistance silicon carbide substrate 101 containing an n-type impurity and a high-resistance silicon carbide layer 102 provided on a main surface of the silicon carbide substrate 101 and doped with an impurity. In a part of a surface portion of the high-resistance silicon carbide layer 102, a high-concentration impurity region 104 doped with an n-type impurity is formed. On the high-concentration impurity region 104, an ohmic electrode 109 formed of nickel silicide is formed. On a surface of the ohmic electrode 109, an interlayer insulating layer 110 is provided. On the interlayer insulating layer 110, a pad electrode 111 is provided. The pad electrode 111 is in contact with the ohmic electrode 109 via a contact hole formed in the interlayer insulating layer 110.

In order to form the ohmic electrode 109 on the high-concentration impurity region 104, it is necessary to form a nickel layer on the high-concentration impurity region 104 formed of silicon carbide and perform thermal treatment thereon at about 1000° C., as described above. The thermal treatment mutually diffuses Ni and Si in silicon carbide, which forms the ohmic electrode 109 formed of nickel silicide.

However, in this process, carbon in silicon carbide is diffused on the surface of the ohmic electrode 109 and deposited as graphite, so that a graphite deposition layer 113 is formed. This graphite presents the problems of increasing the contact resistance ($\rho_c$) of the ohmic electrode 109 and decreasing the adhesiveness between the ohmic electrode 109 and the pad electrode 111 to deteriorate the reliability.

As described above, silicon carbide semiconductor devices are anticipated as power devices operable at a higher frequency with a larger current. However, there is a problem that where a conventional MISFET using a silicon carbide semiconductor is operated at a high frequency (about 100 kHz), a delay caused by the gate capacitance and the gate resistance is increased to deteriorate the switching characteristics.

In order to reduce the delay, it is effective to decrease the gate capacitance and the gate resistance. Most of the gate capacitance is influenced by the gate insulating layer. Therefore, it is conceivable to increase the thickness of the gate insulating layer in order to decrease the gate capacitance. However, this lowers the driving capability of the MISFET. Therefore, in order to realize a high performance silicon carbide semiconductor device, it is important to decrease the gate resistance.

The present invention for solving at least one of the above-described various problems of the conventional art has an object of realizing a semiconductor device having superb characteristics.

Means for Solving the Problems

A semiconductor device according to the present invention comprises a silicon carbide semiconductor substrate including a silicon carbide layer; a high-concentration impurity region provided in the silicon carbide layer; an ohmic electrode electrically connected with the high-concentration impurity region; a channel region electrically connected with the high-concentration impurity region; a gate insulating layer provided on the channel region; and a gate electrode provided on the gate insulating layer. The ohmic electrode contains an alloy of titanium, silicon and carbon, and the gate electrode contains titanium silicide.

In a preferable embodiment, the high-concentration impurity region is doped with an n-type impurity at a high concentration.

In a preferable embodiment, the ohmic electrode includes a reaction layer formed of the alloy of titanium, silicon and carbon, and the gate electrode contains a titanium silicide layer.

In a preferable embodiment, the reaction layer in the ohmic electrode and the titanium silicide layer in the gate electrode have difference thicknesses.

In a preferable embodiment, the thickness of the reaction layer in the ohmic electrode is smaller than the thickness of the titanium silicide layer in the gate electrode.

In a preferable embodiment, the ohmic electrode further includes a titanium nitride layer.

In a preferable embodiment, the ohmic electrode, the titanium nitride layer has a larger thickness than the thickness of the reaction layer.

In a preferable embodiment, the reaction layer in the ohmic electrode is in contact with the high-concentration impurity region.

In a preferable embodiment, the gate electrode further includes a polysilicon layer.

In a preferable embodiment, in the gate electrode, the polysilicon layer has a smaller thickness than the thickness of the titanium silicide layer.

In a preferable embodiment, the polysilicon layer in the gate electrode is in contact with the gate insulating layer.

In a preferable embodiment, in the ohmic electrode, the carbon has a high concentration in the high-concentration impurity region and has a low concentration in a surface portion of the ohmic electrode.

In a preferable embodiment, the carbon has a concentration of 5 atom % or lower at a position of the ohmic electrode closest to the surface thereof.

In a preferable embodiment, the semiconductor device further comprises a channel layer provided in a part of a surface portion of the silicon carbide layer so as to be in contact with the high-concentration impurity region. The channel region is located in the channel layer.

In a preferable embodiment, the silicon carbide layer includes a well region doped with a p-type impurity and provided so as to surround the high-concentration impurity region; and the channel region is located in a surface portion of the well region so as to be in contact with a part of the surface of the silicon carbide layer and also so as to connect the high-concentration impurity region and a part of the silicon carbide layer in which the well region is not formed.

In a preferable embodiment, the semiconductor device further comprises another ohmic electrode provided on an surface of the semiconductor substrate which is opposite to the surface on which the silicon carbide layer is provided, and thus has a vertical structure.

A semiconductor device production method according to the present invention comprises step (a) of preparing a silicon carbide semiconductor substrate including a silicon carbide layer having a high-concentration impurity region and a gate insulating layer covering a semiconductor region including a channel region; step (b) of forming a polysilicon layer on the gate insulating layer; step (c) of forming a titanium layer on each of the high-concentration impurity region and the polysilicon layer; and step (d) of thermally treating the titanium layers to cause silicon in the polysilicon layer and silicon and carbon in the high-concentration impurity region to react with the titanium layers, thereby forming an ohmic electrode containing an alloy of titanium, silicon and carbon on the high-concentration impurity region and forming a gate electrode containing titanium silicide on the gate insulating layer.

In a preferable embodiment, the thermal treatment in step (d) is performed at a temperature of 850° C. or higher and 1050° C. or lower.

In a preferable embodiment, the thermal treatment in step (d) is performed in an atmosphere containing nitrogen gas or argon gas.

In a preferable embodiment, the step (c) includes step (c1) of forming a titanium layer on the entirety of a surface of the silicon carbide layer so as to cover the high-concentration impurity region and the polysilicon layer; and step (c2) of patterning the titanium layer by removing an unnecessary part thereof such that the titanium layer is located only on the high-concentration impurity region and the polysilicon layer.

In a preferable embodiment, in the step (c2), the unnecessary part is removed by wet etching.

In a preferable embodiment, in the step (c2), the unnecessary part is removed by dry etching.

In a preferable embodiment, the step (c) includes step (c1) of forming the titanium layer so as to cover the insulating layer, an exposed part of the high-concentration impurity region, and an exposed part of the polysilicon layer. The step (d) includes step (d1) of thermally treating the titanium layer to cause silicon in the polysilicon layer and silicon and carbon in the high-concentration impurity region to react with a part of the titanium layer, thereby forming titanium silicide and an alloy of titanium, silicon and carbon; and step (d2) of removing a part of the titanium layer which remains without being reacted, thereby forming a gate electrode containing the titanium silicide on the gate insulating layer and forming an ohmic electrode containing the alloy on the high-concentration impurity region.

In a preferable embodiment, in the step (d2), the part of the titanium layer which remains without being reacted is removed by wet etching.

Effects of the Invention

In a semiconductor device according to the present invention, the ohmic electrode contains an alloy of titanium, silicon and carbon, and the gate electrode contains titanium silicide. Therefore, in the ohmic electrode, deposition of graphite is prevented when the ohmic contact is formed. This prevents the contact resistance from being increased and also prevents the adhesiveness between the ohmic electrode and the pad electrode from being decreased, and thus deterioration of the reliability can be prevented. In the gate electrode, the formation of titanium silicide can decrease the gate resistance. As a result, the characteristics of the semiconductor device can be improved. In addition, it is possible to form the gate electrode and the ohmic electrode in the same process. This can reduce the production cost and the time required for the production and also can improve the yield.

Figure 1:
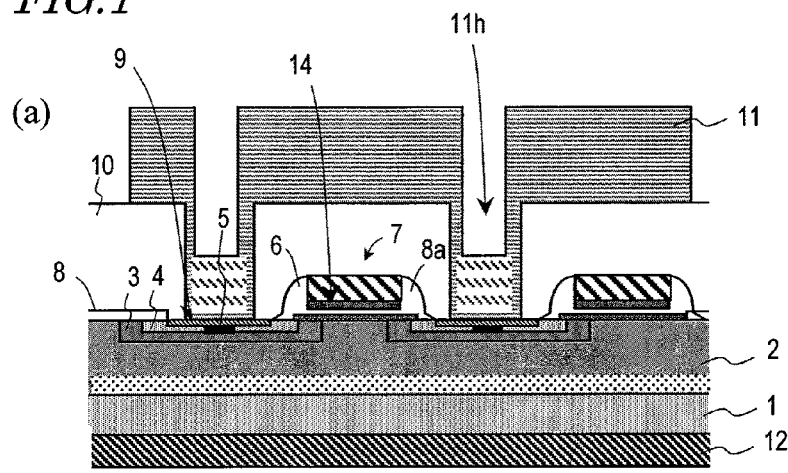
FIG. 1(a) is a schematic cross-sectional view showing a structure of an embodiment of a semiconductor device according to the present invention.
FIGS. 1(b) and 1(c) respectively show a gate electrode and the vicinity thereof and an ohmic electrode and the vicinity thereof in enlargement.
Figure 1:
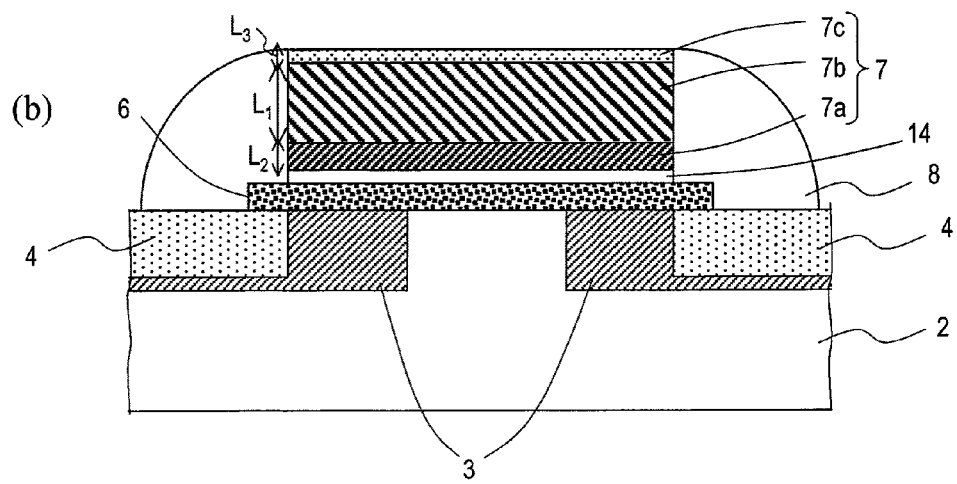
Figure 1:
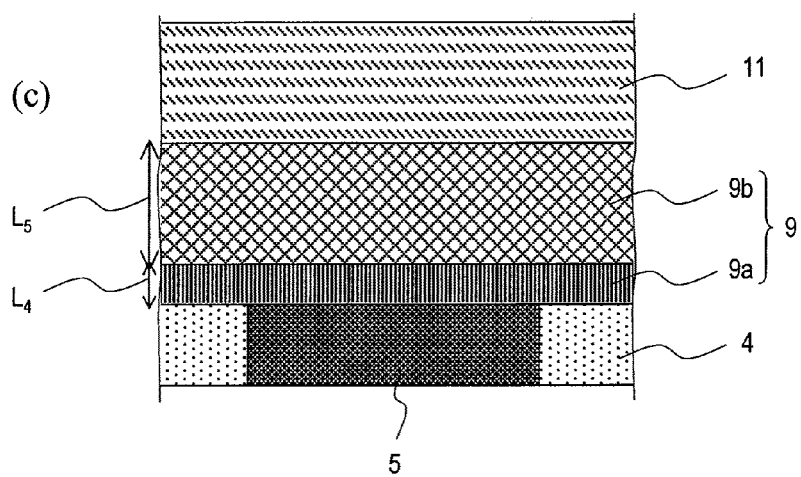

DESCRIPTION OF THE REFERENCE NUMERALS 1, 101 Silicon carbide substrate
2, 102 Silicon carbide layer
3 p-well region
4, 104 High-concentration impurity region
5 p$^+$ contact region
6 Channel layer
7 Gate electrode
8 First interlayer insulating layer
9, 109 Ohmic electrode (source electrode)
10, 110 Second interlayer insulating layer
11, 111 Pad electrode
12 Ohmic electrode (drain electrode)
14 Gate insulating layer
15 Titanium layer
16, 17 Mask
113 Graphite deposition layer

BEST MODE FOR CARRYING OUT THE INVENTION

Hereinafter, embodiments of a semiconductor device according to the present invention will be described. The present invention realizes a silicon carbide semiconductor device including an ohmic electrode with no graphite formation and a low-resistance gate electrode, which is preferably usable for an insulating gate-type transistor such as a MISFET, a MOSFET or the like. In the following embodiments, the present invention will be described by way of a vertical type double implantation MISFET as an example.

FIG. 1(a) is a schematic cross-sectional view showing an embodiment of a semiconductor device according to the present invention. A structure of the semiconductor device will be briefly described.

The semiconductor device shown in FIG. 1(a) includes a silicon carbide semiconductor substrate 1 having a silicon carbide layer 2. The silicon carbide semiconductor substrate 1 is an off substrate having an off angle of 8 degrees from the (0001) surface of 4H-SiC. The silicon carbide semiconductor substrate 1 is doped with an n-type impurity such as nitrogen, phosphorus, arsenic or the like at a concentration of, for example, $1 \times 10^{18}$ cm$^{-3}$ or higher and has a low resistance. The silicon carbide layer 2 is provided on the silicon carbide semiconductor substrate 1 by epitaxial growth. In the case where the semiconductor device is, for example, a MISFET having a withstand voltage of 1400 V, the silicon carbide layer 2 is preferably doped with an n-type impurity such as nitrogen or the like at about $1 \times 10^{15}$ cm$^{-3}$ to $1 \times 10^{16}$ cm$^{-3}$ and has a high resistance.

In the silicon carbide layer 2, a p-well region 3 is provided inward from a surface of the silicon carbide layer 2. In the p-well region 3, a high-concentration impurity region 4 is formed inward from the surface of the silicon carbide layer 2. Owing to this, the high-concentration impurity region 4 is surrounded by the p-well region 3 left after the formation of the high-concentration impurity region 4. The high-concentration impurity region 4 is doped with an n-type impurity and acts as a source region. In the high-concentration impurity region 4, a p$^+$ contact region 5 is provided inward from the surface of the silicon carbide layer 2 so as to reach the p-well region 3. The p-well region 3, the high-concentration impurity region 4 and the p$^+$ contact region 5 respective have impurity concentrations of, for example, $1 \times 10^{16}$ cm$^{-3}$ to $1 \times 10^{18}$ cm$^{-3}$, about $1 \times 10^{19}$ cm$^{-3}$ and about $5 \times 10^{19}$ cm$^{-3}$. On the high-concentration impurity region 4, an ohmic electrode 9 is provided. As described below, the ohmic electrode 9 is electrically connected with the high-concentration impurity region 4 by ohmic contact, and contains an alloy of titanium, silicon and carbon.

A channel layer 6 is provided so as to cover a part of the surface of the silicon carbide layer 2 on which the p-well region 3 is not provided, a part of the p-well region 3 which is exposed on the surface of the silicon carbide layer and a part of the high-concentration impurity region 4 which is also exposed on the surface of the silicon carbide layer 2. The channel layer 6 contains a multiple δ doped layer and is formed by epitaxial growth. The multiple δ doped layer has a structure in which a high-concentration doped layer (δ doped layer) which exhibits a steep concentration gradient and a low-concentration doped layer (undoped layer) are alternately stacked. On the channel layer 6, a gate insulating layer 14 is provided, and on the gate insulating layer 14, a gate electrode 7 is provided. As described below, the gate electrode 7 contains titanium silicide. A first interlayer insulating layer 8 covers the surface of the silicon carbide layer 2 except for the gate electrode 7 and the ohmic electrode 9. A second interlayer insulating layer 10 is provided so as to cover the first interlayer insulating layer 8.

On the second interlayer insulating layer 10, a pad electrode 11 is provided. The pad electrode 11 is electrically connected with the ohmic electrode 9 via a contact hole formed in the second interlayer insulating layer. In the case where the contact hole has a large size, the pad electrode 11 is also provided on the ohmic electrode 9 in the contact hole and on a side wall of the contact hole. As a result, a hole 11h is provided. In the case where the contact hole has a small size, the hole 11h may be closed at the top.

On a main surface of the silicon carbide semiconductor substrate 1 on which the silicon carbide layer is not provided, another ohmic electrode 12 acting as a drain electrode is provided. The ohmic electrode 12 may be formed of a plurality of layers.

With the semiconductor device having the above-described structure, an electric current passing through a channel region formed in the channel layer 6 can be controlled by changing the voltage applied to the gate electrode 7. Owing to this, the electric current flowing in a path formed of the ohmic electrode 12, the silicon carbide semiconductor substrate 1, the silicon carbide layer 2, the channel layer 6, the high-concentration impurity region 4 and the ohmic electrode 9 can be adjusted.

Now, structures of the gate electrode 7 and the ohmic electrode 9 will be described in detail. FIG. 1(b) is an enlarged cross-sectional view showing a structure of the gate electrode 7 and the vicinity thereof. As shown in FIG. 1(b), the gate electrode 7 includes a polysilicon layer 7a, a titanium silicide layer 7b and a titanium nitride layer 7c. The polysilicon layer 7a is mainly formed of polysilicon doped with an impurity, and the titanium silicide layer 7b is mainly formed of titanium silicide ($TiSi_2$). The titanium silicide contains an impurity. The polysilicon layer 7a is in contact with the gate insulating layer 14. Herein, the term "mainly" means that the component for which this term is used is contained at the highest content among the components contained in the respective element.

FIG. 1(c) is an enlarged cross-sectional view showing a structure of the ohmic electrode 9 and the vicinity thereof. As shown in FIG. 1(c), the ohmic electrode 9 includes a reaction layer 9a and a titanium nitride layer 9b. The reaction layer 9a is mainly formed of an alloy of titanium, silicon and carbon, and the titanium nitride layer 9b is mainly formed of titanium nitride. On the titanium nitride layer 9b, the pad electrode 11 is located, and no graphite is deposited between the titanium nitride layer 9b and the pad electrode 11. The reaction layer 9a is in contact with the high-concentration impurity region 4 and the $p^+$ contact region 5.

The gate electrode 7 and the ohmic electrode 9 respectively include the titanium silicide layer 7b and the reaction layer 9a. These layers both contain silicon. However, silicon in the titanium silicide layer 7b of the gate electrode 7 is derived from the polysilicon formed as a part of the gate electrode 7, whereas silicon in the reaction layer 9a of the ohmic electrode 9 is derived from silicon of silicon carbide contained in the high-concentration impurity region 4.

Figure 2:
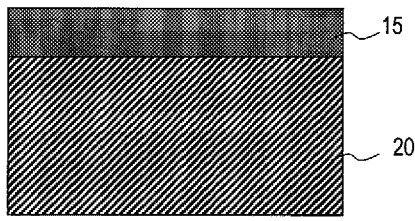
FIGS. 2(a) and 2(c) are schematic cross-sectional views showing production steps of the gate electrode of the semiconductor device shown in FIG. 1, and FIGS. 2(b) and 2(d) are schematic cross-sectional views showing production steps of the ohmic electrode of the semiconductor device shown in FIG. 1.
Figure 2:
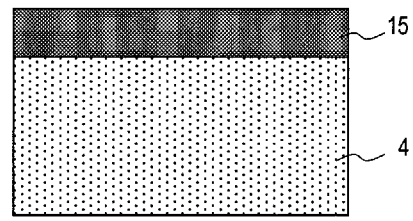
Figure 2:
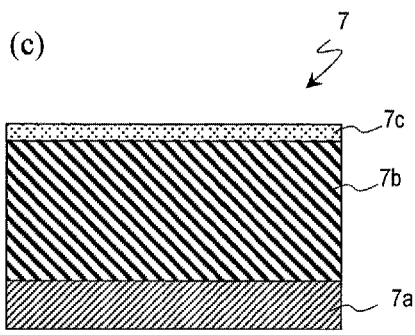
Figure 2:
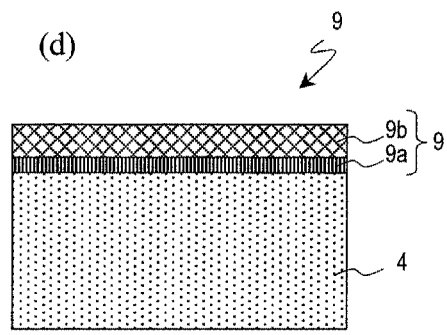

FIGS. 2(a) through 2(d) are cross-sectional views showing steps for forming the gate electrode 7 and the ohmic electrode 9. Among these figures, FIGS. 2(a) and 2(c) show steps for forming the gate electrode 7, and FIGS. 2(b) and 2(d) show steps for forming the ohmic electrode 9. The gate electrode 7 and the ohmic electrode 9 are preferably formed in the same thermal treatment process. First, as shown in FIG. 2(a), in order to form the gate electrode, a titanium layer 15 is formed on a patterned polysilicon layer 20. Also, as shown in FIG. 2(b), in order to form the ohmic electrode, a titanium layer 15 is formed on the high-concentration impurity region 4. These titanium layers 15 may be formed separately, but use of a titanium film formed in the same step can reduce the number of production steps and also the production cost.

When thermal treatment is performed, at the interface between the titanium layer 15 and the polysilicon layer 20, titanium and silicon are mutually diffused to form titanium silicide. Also at the interface between the titanium layer 15 and the high-concentration impurity region 4, titanium, and silicon and carbon, are mutually diffused to form an alloy of titanium, silicon and carbon. In the case where the thermal treatment is performed under a nitrogen atmosphere, a surface of the titanium layer 15 is nitrided. As a result, as shown in FIG. 2(c), the gate electrode 7 including the polysilicon layer 7a, the titanium silicide layer 7b and the titanium nitride layer 7c is formed. Also, as shown in FIG. 2(d), the ohmic electrode 9 including the reaction layer 9a and the titanium nitride layer 9b is formed.

Figure 3:
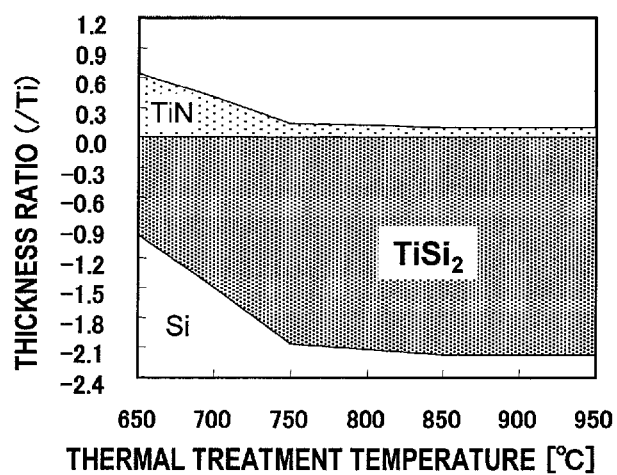
FIG. 3 is a graph showing the temperature dependence of the thickness of a titanium silicide layer which is generated when titanium is deposited on a silicon substrate and treated at a high temperature.

FIG. 3 is a graph showing the temperature dependence of the thickness of the titanium silicide layer which is generated when titanium is deposited on a silicon substrate and treated at a high temperature. Thermal treatment is preferably performed under an inactive atmosphere so as not to oxidize titanium or silicon. In the case where nitrogen is selected as an inactive gas, titanium reacts with nitrogen to form titanium nitride. As shown in FIG. 3, the reaction of titanium and nitrogen proceeds even at a relatively low temperature. Therefore, where the thermal treatment temperature is about 650° C., about ½ of the titanium layer 15 becomes titanium nitride and ½ becomes titanium silicide. Where the thermal treatment temperature is higher, a larger amount of titanium in the titanium nitride reacts with silicon to form titanium silicide. Therefore, as the temperature rises, the titanium nitride becomes thinner and titanium silicide becomes thicker. As is clear from FIG. 3, at the thermal treatment temperature is about 750° C. or higher, the formation of titanium silicide is almost completed. Even where the thermal treatment temperature is still higher, the generation amount of titanium silicide is not increased almost at all. In the range of 850° C. or higher, the thickness of the titanium silicide layer is almost constant.

Figure 4:
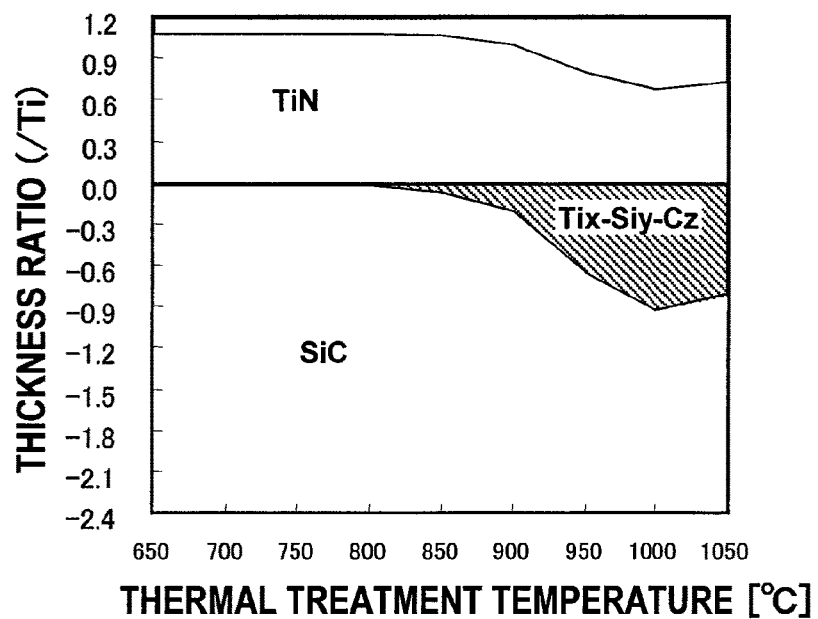
FIG. 4 is a graph showing the temperature dependence of the thickness of an alloy layer of titanium, silicon and carbon which is generated when titanium is deposited on a silicon carbide substrate and treated at a high temperature.

FIG. 4 is a graph showing the temperature dependence of the thickness of the reaction layer formed of an alloy of titanium, silicon and carbon which is generated when titanium is deposited on silicon carbide and treated at a high temperature. Like in the case of the gate electrode, where thermal treatment is performed under a nitrogen atmosphere, titanium in the titanium layer reacts with nitrogen to form titanium nitride. However, because silicon carbide is a compound which is stable even at a relatively high temperature, silicon and carbon in the silicon carbide does not react with titanium until the temperature reaches about 800° C. Where the thermal treatment is performed at a temperature exceeding 800° C., silicon and carbon in the silicon carbide reacts with titanium to start forming a reaction layer of an alloy of titanium, silicon and carbon. Where the thermal treatment temperature is in the range of about 800° C. to 1000° C., as the thermal treatment temperature rises, the thickness of the reaction layer generated increases. Where the thermal treatment temperature is 1000° C., about ⅓ becomes the reaction layer and ⅔ remains as the titanium nitrogen layer.

Samples for performing analyses shown in FIG. 3 and FIG. 4 were prepared as follows. A titanium layer was formed on a silicon substrate or a silicon carbide substrate and thermally treated at each of the temperatures under a nitrogen atmosphere. The titanium nitride layer formed as a result of the thermal treatment was removed by wet etching. By analyzing the characteristic x rays from titanium which reacted with silicon in these samples and titanium which reacted with silicon and carbon in these samples, the thickness of the titanium layer which contributed to the reaction was detected.

Then, the thickness ratio of the formed titanium layer and the formed titanium silicide layer or the formed reaction layer was calculated.

Even where the thermal treatment temperature is raised to 1050° C., the entirety of the titanium deposited on the silicon carbide does not become an alloy layer of titanium, silicon and carbon. However, whether the contact of a semiconductor material and a metal material has a Schottky characteristic or an ohmic characteristic mainly depends on the characteristics of the interface. Therefore, even where the formed alloy layer is not thick, it is possible to obtain a good ohmic junction.

Although it cannot be shown in FIG. 4, graphite is not deposited along with the formation of the alloy of titanium, silicon and carbon even where the thermal treatment temperature is raised. A conceivable reason for this is that a combination of titanium and silicon carbide makes it possible to form a stable alloy of titanium, silicon and carbon and thus prevents carbon from being freed as graphite. This is a significant difference from the conventional ohmic electrode using nickel. It is considered that because nickel does not form a stable compound with carbon, carbon generated by the formation of silicide is freed without forming any compound with nickel, which causes graphite to be deposited.

Figure 5:
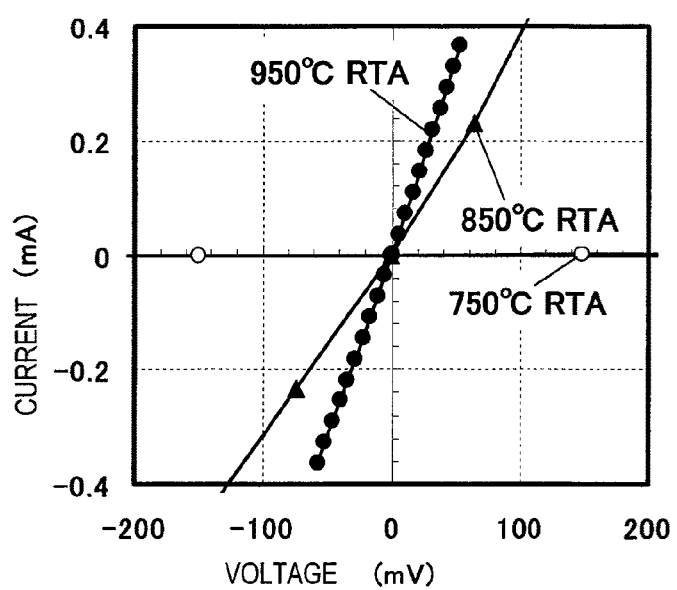
FIG. 5 shows the current vs. voltage characteristic of a silicon carbide/titanium interface which is formed by depositing a titanium film on an n-type silicon carbide substrate and performing thermal treatment thereon.

FIG. 5 shows the current vs. voltage characteristic of a titanium/silicon carbide contact obtained by depositing titanium to 150 nm on an n-type silicon carbide substrate (impurity concentration: about $5 \times 10^{19}$ cm$^{-3}$) and performing thermal treatment thereon at 750° C., 850° C. and 950° C. for 1 minute under a nitrogen atmosphere. As shown in FIG. 5, where the thermal treatment is performed at 750° C., the reaction at the titanium-silicon carbide interface is insufficient and so an ohmic electrode is not obtained. By contrast, where the thermal treatment is performed at 850° C., an almost ohmic current vs. voltage characteristic is obtained. The contact resistance is about $5 \times 10^{-5}$ Ωcm$^2$, and any resistance increase by graphite deposition is not caused. As is clear from FIG. 5, where the thermal treatment is performed at 950° C., the current changes almost linearly with respect to the voltage, which indicates that a superb ohmic electrode is obtained. The contact resistance is about $2 \times 10^{-5}$ Ωcm$^2$.

Figure 6:
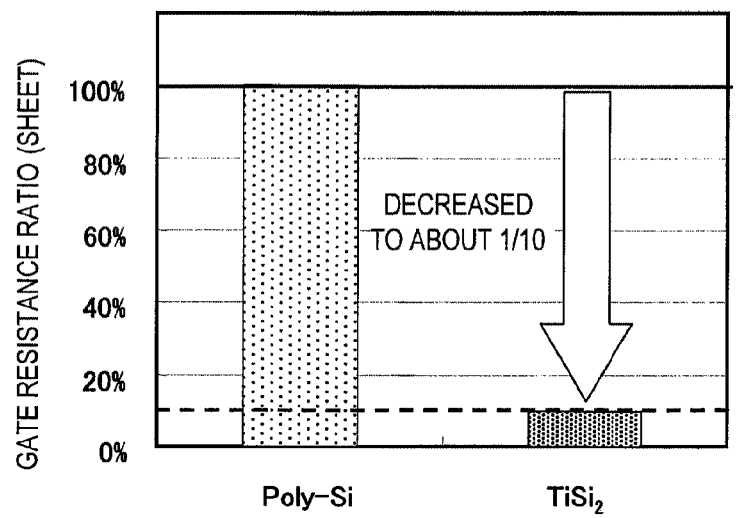
FIG. 6 shows the sheet resistance of an electrode formed by depositing a titanium film on polysilicon and performing thermal treatment thereon.
Figure 7:
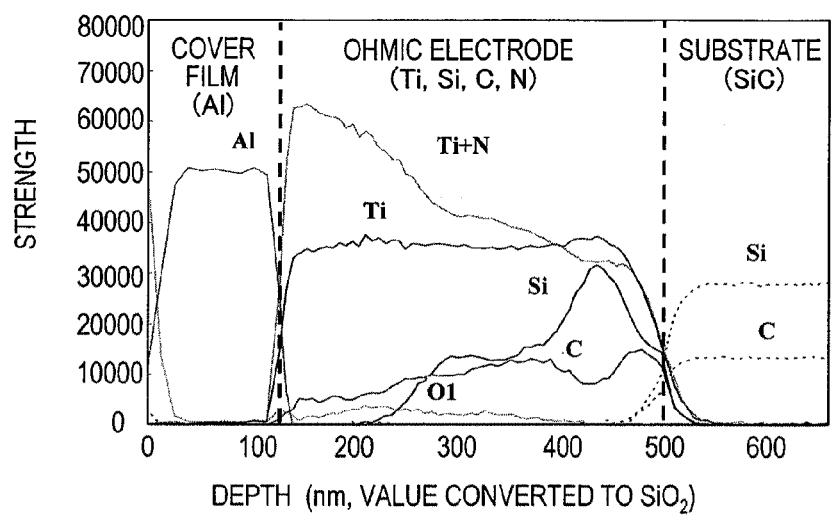
FIG. 7 shows AES analysis results of an ohmic electrode obtained by forming a titanium film on a silicon carbide substrate and performing thermal treatment thereon at 900° C.
Figure 8:
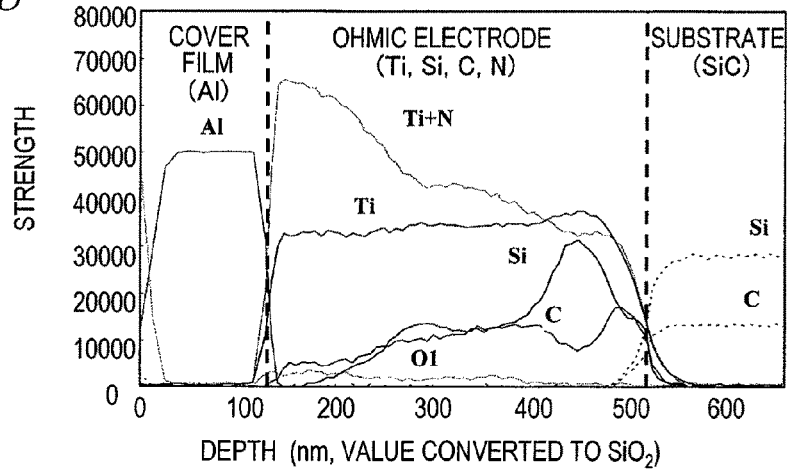
FIG. 8 shows AES analysis results of an ohmic electrode obtained by forming a titanium film on a silicon carbide substrate and performing thermal treatment thereon at 950° C.
Figure 9:
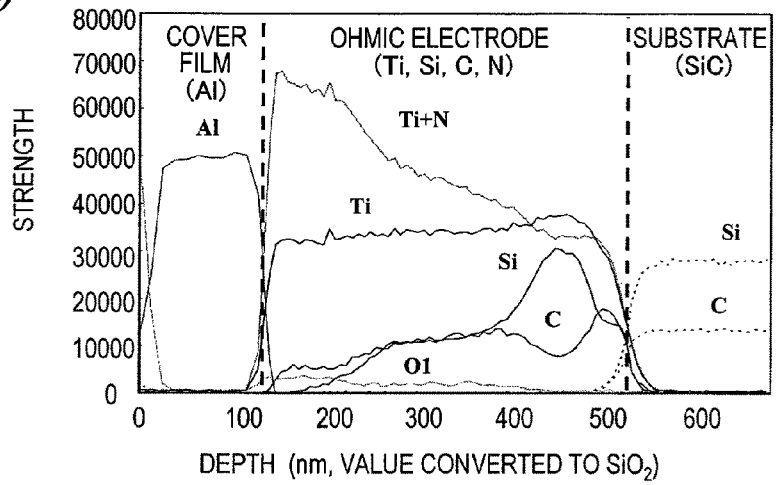
FIG. 9 shows AES analysis results of an ohmic electrode obtained by forming a titanium film on a silicon carbide substrate and performing thermal treatment thereon at 1000° C.
Figure 10:
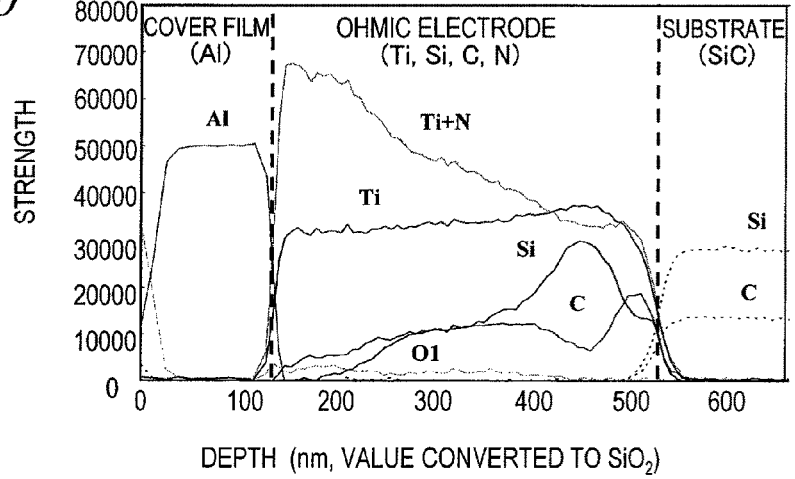
FIG. 10 shows AES analysis results of an ohmic electrode obtained by forming a titanium film on a silicon carbide substrate and performing thermal treatment thereon at 1050° C.

FIG. 6 shows a sheet resistance in the case where titanium is deposited to 100 nm on polysilicon doped with phosphorus (P) is thermally treated at 950° C. for 1 minute under a nitrogen atmosphere. The sheet resistance is shown with respect to the case where titanium is not deposited. As a result of the thermal treatment, most of the deposited Ti reacts with polysilicon to form silicide. Therefore, the sheet resistance is decreased to about ⅒ of the case where only polysilicon is thermally treated.

As is understood from the above, by forming a titanium layer on silicon carbide and performing thermal treatment, a reaction layer formed of an alloy of titanium, silicon and carbon is formed at an interface between silicon carbide and the titanium layer, and thus an ohmic electrode having a low resistance and does not cause graphite deposition can be formed. By forming a titanium layer on polysilicon and performing thermal treatment, most of the polysilicon is silicided and thus a gate electrode having a low resistance can be formed.

These two electrodes do not need to be formed at the same time in the same process. However, by forming the ohmic electrode and the gate electrode in the same process, the number of production steps of the semiconductor device can be reduced, and the production cost and the time required for the production can also be reduced. Reduction of the number of production steps provides various advantages that, for example, the yield can be improved.

In order to form the ohmic electrode and the gate electrode in the same process, it is preferable to perform the thermal treatment for silicidation at 850° C. or higher. Where the thermal treatment is performed at lower than 850° C., silicidation proceeds in the gate electrode but the silicidation reaction may be possibly insufficient in the ohmic electrode.

A higher thermal treatment temperature is more preferable because reaction is promoted at each of the electrodes. However, where the thermal treatment temperature exceeds 1050° C., the materials used for the interlayer insulating layers such as silicon nitride, silicon oxide or the like may possibly denatured or deformed. Therefore, where the gate electrode and the ohmic electrode are formed at the same time, it is preferable to perform the thermal treatment at a temperature of 850° C. or higher and 1050° C. or lower. More preferably, the thermal treatment temperature is 900° C. or higher and 1000° C. or lower.

Where the gate electrode and the ohmic electrode are formed at the same time, as described above with reference to FIG. 2(a) and FIG. 2(b), it is preferable to form the titanium layers 15 of the same titanium film. Therefore, it is difficult to make a difference between the thickness of the pre-thermal treatment titanium layer 15 on the high-concentration impurity region 4 for forming the ohmic electrode 9 and the thickness of the pre-thermal treatment titanium layer 15 on the polysilicon layer 20 for forming the gate electrode 7.

However, most of the titanium layer 15 for the gate electrode 7 reacts with the polysilicon layer 20 to become the titanium silicide layer 7b, whereas the reaction layer 9a generated for the ohmic electrode 9 is thin and most of the titanium layer 15 for the ohmic electrode 9 remains as titanium or titanium nitride. Therefore, the thickness of the titanium layer 15 may be determined such that the titanium silicide layer 7b in accordance with the resistance value required of the gate electrode 7 is formed in the gate electrode 7. At this point, as shown in FIG. 1(b) and FIG. 1(c), thickness $L_1$ of the titanium silicide layer 7b in the post-thermal treatment gate electrode 7 and thickness $L_4$ of the reaction layer 9a in the post-thermal treatment ohmic electrode 9 has a ratio of about 4:1. Namely, the thickness of the reaction layer 9a in the ohmic electrode 9 is always smaller than the thickness of the titanium silicide layer 7b in the gate electrode 7.

Preferable thicknesses of the titanium silicide layer 7b and the reaction layer 9a depend on the maximum operating frequency and the operating current of the semiconductor device which are defined by the usage of the semiconductor device. For example, as shown in FIG. 1(b), thickness $L_2$ of the polysilicon layer 7a is 200 nm to 1000 nm, and thickness $L_1$ of the titanium silicide layer 7b is 150 nm to 900 nm. Thickness $L_3$ of the titanium nitride layer 7c is 10 nm to 50 nm. In order to decrease the resistance of the gate electrode 7, it is preferable that thickness $L_2$ of the polysilicon layer 7a is smaller than thickness $L_1$ of the titanium silicide layer 7b. As shown in FIG. 1(c), thickness $L_4$ of the reaction layer 9a is 30 nm to 250 nm, and thickness $L_5$ of the titanium nitride layer 9b is 50 nm to 300 nm.

Now, the analysis results of the composition in a depth direction of ohmic electrodes, obtained by forming a titanium film on a silicon carbide substrate and performing thermal treatment thereon with various temperatures, will be described.

Samples for the analysis were prepared as follows. A titanium layer having a thickness of 150 nm was formed on a silicon carbide substrate and thermally treated at each of 900° C., 950° C. and 1000° C. and 1050° C. for 2 minutes under a nitrogen atmosphere. After the thermal treatment, on a surface of the obtained ohmic electrode, a cover film formed of aluminum having a thickness of 100 nm was formed. These samples were analyzed in the depth direction by Auger electron spectroscopy (AES). FIG. 7 through FIG. 10 show the analysis results of the samples thermally treated respectively at 900° C., 950° C. and 1000° C. and 1050° C. In these figures, the curves represented by Al, Si, C, Ol, Si and C each show the distribution of the respective element. The curve represented by Ti+N shows the distribution of titanium bonded with nitrogen. The curve represented by Ti shows the distribution of titanium bonded with elements other than nitrogen. Since the detection sensitivity of the elements are different, the strength does not accurately show the presence ratio of the elements.

As shown in these figures, in any of the samples, carbon is not present almost at all at the interface between the ohmic electrode and the aluminum film. Even by thermal treatment, graphite is not deposited. In these samples, titanium nitrogen is the main component in an area from the interface with the aluminum film to a depth of about 200 nm when converted into the $SiO_2$ sputter rate. It is understood from this that a titanium nitrogen layer is formed on a surface of the ohmic electrode. In an area from the interface with the silicon carbide substrate to the depth of about 200 nm from the interface with the aluminum film, titanium, silicon and carbon are present. It is understood seen from this that a reaction layer formed of an alloy of these elements is formed.

In the ohmic electrode, the concentration of carbon is higher as being closer to the silicon carbide substrate and is lower as being closer to the interface with the aluminum film, i.e., the surface of the ohmic electrode. On the analysis results shown in FIG. 7 through FIG. 10, using titanium silicide ($TiS_2$), silicon carbide and other samples for amount detection, peak separation of the bonding state of titanium and each of the elements was performed to correct the detection sensitivity, and thus the composition ratio of the elements in the ohmic electrode was obtained. It was found that in all the samples, the carbon concentration at the top surface of the ohmic electrode in contact with the aluminum film was 5 atom % or lower.

There is a tendency that as the thermal treatment temperature rises, the carbon concentration in the vicinity of the interface between the silicon carbide substrate and the ohmic electrode slightly increases and silicon is slightly diffused toward the titanium nitride layer. However, the distributions of titanium, silicon and carbon are not changed almost at all. Therefore, it is considered that the reaction layer formed of an alloy of titanium, silicon and carbon is thermally stable and that it does not occur that carbon is freed from the reaction layer to cause graphite to be deposited on the surface of the ohmic electrode.

Samples which were thermally treated at 1000° C. and 1050° C. were further thermally treated at 460° C. for 3 minutes and analyzed in the depth direction also by Auger electron spectroscopy. It was found that the distribution of each element was not changed almost at all.

From these results, it is considered that the semiconductor device according to the present invention, even after being operated for a long time, suppresses graphite from being deposited on the surface of the ohmic electrode and does not cause an increase of the contact resistance or a decrease of the adhesion strength of the ohmic electrode and the pad electrode. Accordingly, the ohmic electrode in the semiconductor device according to the present invention is considered to have high reliability.

As described above, in the semiconductor device according to the present invention, the ohmic electrode contains an alloy of titanium, silicon and carbon, and the gate electrode contains titanium silicide. Therefore, in the ohmic electrode, the formation of the alloy prevents graphite from being deposited when the ohmic contact is formed. This prevents the contact resistance from being increased and also prevents the adhesiveness between the ohmic electrode and the pad electrode from being decreased, and thus deterioration of the reliability can be prevented. In the gate electrode, the formation of the titanium silicide can decrease the gate resistance. As a result, the characteristics of the semiconductor device can be improved. Especially, the decrease of the gate resistance can prevent the switching delay. In addition, it is possible to form the gate electrode and the ohmic electrode in the same process. This can reduce the production cost and the time required for the production and also can improve the yield.

Figure 11:
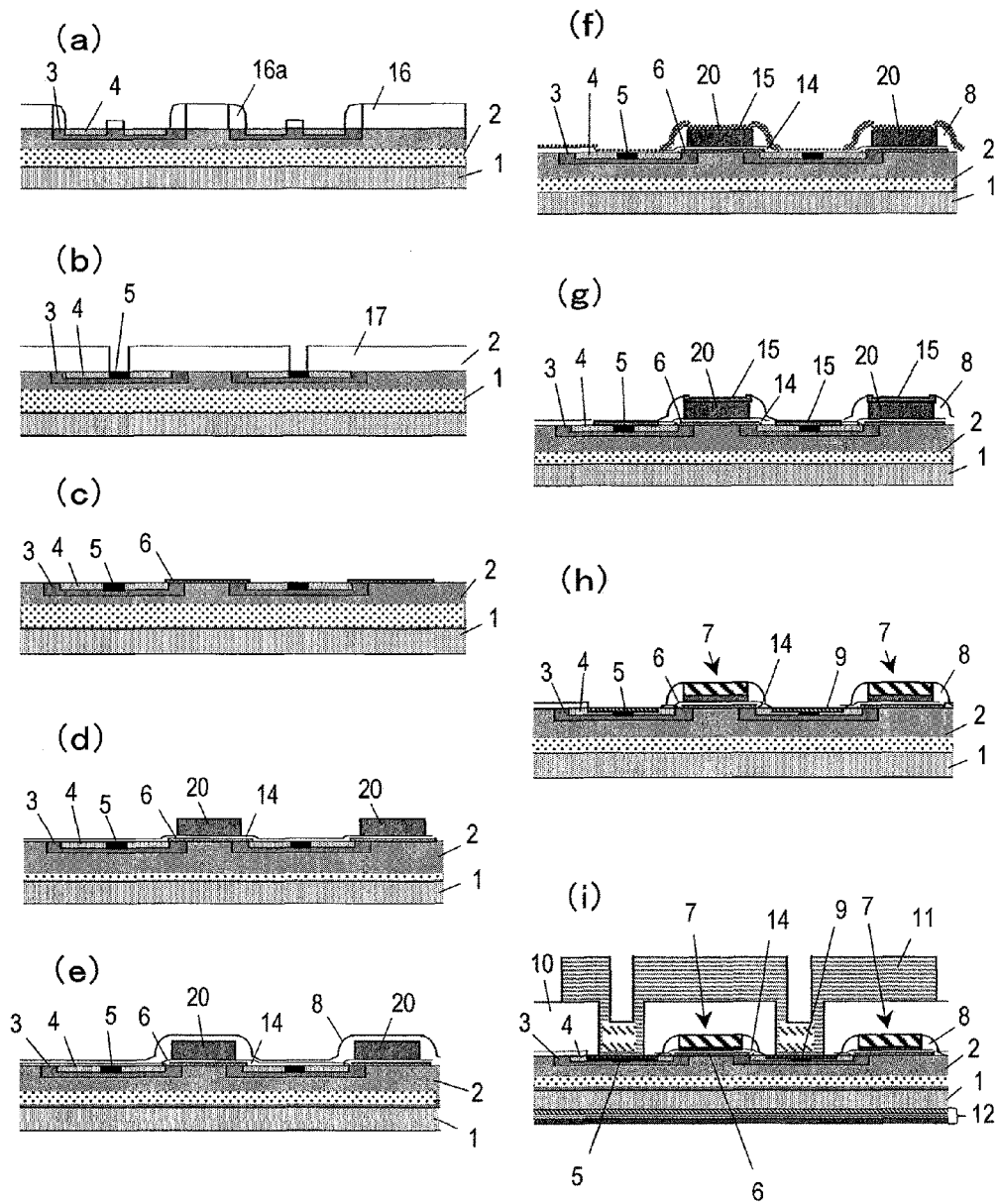
FIGS. 11(a) through 11(i) are cross-sectional views showing structures of the semiconductor device shown in FIG. 1 while being produced.

Hereinafter, an example of a method for producing the semiconductor device according to the present invention will be described. FIG. 11($a$) through FIG. 11($i$) are cross-sectional views showing structures of the semiconductor device while being produced.

First, as shown in FIG. 11($a$), the silicon carbide substrate 1 having an off angle of 8 degrees from the (0001) surface of 4H-SiC is prepared. The silicon carbide substrate 1 is doped with an n-type impurity at about $8\times10^{18}$ cm$^{-3}$. On the main surface of the silicon carbide substrate 1, the high-resistance silicon carbide layer 2 containing an n-type impurity at a lower concentration than the silicon carbide substrate 1 is epitaxially grown by thermal CVD or the like. For performing the epitaxial growth, for example, silane ($SiH_4$) and propane ($C_3H_8$) are used as a material gas, hydrogen ($H_2$) is used as a carrier gas, and nitrogen ($N_2$) is used as a dopant gas. For example, for producing a MISFET having a withstand voltage of 1400 V, it is preferable that the impurity concentration of the silicon carbide layer 2 is $1\times10^{15}$ cm$^{-3}$ to $1\times10^{16}$ cm$^{-3}$ and that the thickness thereof is 10 μm or greater.

Next, a part of the silicon carbide layer 2 is doped with a p-type impurity (aluminum, boron or the like) by ion implantation to form the p-well region 3 inward from the surface of the silicon carbide layer 2. The p-well region 3 is formed as follows. A silicon oxide layer (not shown) having a thickness of about 3 μm to act as an implantation mask is deposited on a top surface of the silicon carbide layer 2, and an opening is formed, by photolithography and dry etching, only in a part of the silicon oxide layer in which the p-well region 3 is to be formed. In order to reduce the implantation crystal defects, ion implantation of aluminum or boron is performed while the substrate temperature is kept as high as 500° C. or higher. After the ion implantation, the silicon oxide layer used as the mask is removed by hydrogen fluoride. The concentration of the p-type impurity in the p-well region 3 is usually about $1\times10^{17}$ cm$^{-3}$ to $1\times10^{18}$ cm$^{-3}$. The p-well region 3 has a depth of about 1 μm so as not to be pinched off.

Next, a silicon oxide layer having a thickness of about 1 μm is deposited on the silicon carbide layer 2, and an opening is formed, by photolithography and dry etching, only in a part of the silicon oxide layer in which the high-concentration impurity region 4 is to be formed. Thus, a mask 16 is formed. In order to accurately form the p-well region 3 exposed to the surface of the silicon carbide layer 2, the mask 16 may be provided with a side wall 16$a$. Using the mask 16, a part of a surface portion of the p-well region 3 is doped with a high-concentration n-type impurity by ion implantation to form the high-concentration impurity region 4. In this process, in order to reduce the implantation defect, ion implantation of nitrogen or phosphorus is performed while the substrate temperature is kept as high as 500° C. or higher. After the ion implantation, the silicon oxide layer 16 used as the mask is removed by hydrogen fluoride. The concentration of the impurity in the high-concentration impurity region 4 is usually about $1 \times 10^{19}$ cm$^{-3}$, which is lower than the concentration of the impurity in the p$^+$ contact region 5, which is to be formed later. In the case where the impurity concentration in the high-concentration impurity region 4 is about the same as that in the p$^+$ contact region 5, the mask 16 used for forming the high-concentration impurity region 4 needs to cover the p$^+$ contact region 5. The high-concentration impurity region 4 has a depth of, for example, about 300 nm, which is shallower than the depth of the p$^+$ contact region 5.

Next, as shown in FIG. 11(b), in order to provide a contact between the p-well region 3 and the ohmic electrode to be formed later, a part of the surface portion of the p-well region 3 is doped with a p-type impurity at a high concentration by ion implantation using a mask 17. Thus, the p$^+$ contact region 5 is formed. The depth of the p$^+$ contact region 5 is about 300 nm, and the concentration of the impurity thereof is about $5 \times 10^{19}$ cm$^{-3}$ or higher. The ion implantation is performed in the same manner as for forming the p-well region 3. Then, the mask 17 is removed.

Then, in order to activate the implanted impurity, activation annealing is performed at 1700° C. for 30 minutes in an inert gas atmosphere of argon or the like. By this treatment, exposed surfaces of the silicon carbide layer 2, the p-well region 3, the p$^+$ type contact region 5 and the high-concentration impurity region 4 are caused to have projections called "macro steps" or "hillocks" having heights of about 10 nm to 100 nm. This increases the surface roughness and deteriorates the smoothness of the surface.

Next, as shown in FIG. 11(c), the channel layer 6 is epitaxially grown on the silicon carbide layer 2, the p-type well 3, the high-concentration impurity region 4 and the p$^+$ contact region 5 by, for example, thermal CVD. For forming the channel layer 6, for example, silane (SiH$_4$) and propane (C$_3$H$_8$) are used as a material gas, hydrogen (H$_2$) is used as a carrier gas, and nitrogen (N$_2$) is used as a dopant gas. Then, a part of the channel layer 6 which is located above the high-concentration impurity region 4 and the p$^+$ contact region 5 is removed by, for example, RIE to form a contact hole. In this process, over-etching is performed down to a depth of, for example, 50 nm or greater from the surface of the p$^+$ contact region 5 and the source region 4.

Next, as shown in FIG. 11(d), exposed surfaces of the channel layer 6, the high-concentration impurity region 4 and the p$^+$ contact region 5 are thermally oxidized to form the gate insulating layer 14 of a silicon oxide layer. The gate insulating layer 14 is formed as follows, for example. The silicon carbide substrate 1 is held in a quartz tube, and oxygen is introduced into the quartz tube at a flow rate of 2.5 (liters/min.). Thermal oxidation is performed for 2.5 hours while the temperature in the quartz tube is kept at 1180° C. As a result, the gate insulating layer 14 having a thickness of about 70 nm can be formed.

Next, a polysilicon film having a thickness of 500 nm is deposited by low pressure CVD, and a part of the polysilicon film which is located in and around the contact hole is removed by, for example, RIE or the like. As a result, the polysilicon layer 20 is formed on the gate insulating layer 14. The polysilicon layer 20 is to be included in the gate electrode.

Then, as shown in FIG. 11(e), a first interlayer insulating layer 8 formed of silicon nitride (SiN) is grown to about 100 nm by reduced pressure CVD to cover the surface of the silicon carbide layer 2 and the polysilicon layer 20. Using the general photolithography and wet etching, a part of the first interlayer insulating layer 8 located in and around the contact hole and a part of the first interlayer insulating layer 8 located on the polysilicon layer 20 are removed. As a result, a part of the high-concentration impurity region 4 and the p$^+$ contact region 5 are exposed to the contact hole.

As shown in FIG. 11(f), the titanium layer 15 is deposited on the first interlayer insulating layer 8 and a part from which the first interlayer insulating layer 8 has been removed (a part on which the ohmic electrode is to be formed and on a top surface of the polysilicon layer 20). The titanium layer 15 preferably has a thickness of 50 nm or greater in order to make the thickness of the alloy layer of titanium, silicon and carbon in the ohmic electrode 9 to be formed later 10 nm or greater.

Next, as shown in FIG. 11(g), the titanium layer 15 on the first interlayer insulating layer 8 is removed by dry etching such as RIE or the like or wet etching. As a result, the titanium layer 15 is removed except for an area thereof to be included in the ohmic electrode and the gate electrode.

Next, as shown in FIG. 11(h), thermal treatment is performed for 1 minute or longer in an inert gas atmosphere of nitrogen, argon or the like. As a result of this thermal treatment, the titanium layer 15 reacts with silicon and carbon in the silicon carbide layer 2, and the titanium layer reacts with silicon in the polysilicon layer 20. The thermal treatment temperature is preferably 850° C. or higher and 1050° C. or lower in order to allow titanium and silicon carbide to form a reaction layer and prevent materials used for the interlayer insulating layers such as titanium nitride, silicon oxide or the like from being denatured or deformed.

As a result of the thermal treatment, as shown in FIG. 1(b), the low-resistance gate electrode 7 in which most of the polysilicon layer 20 is silicided is formed. Also as shown in FIG. 1(c), the ohmic electrode 9 in ohmic contact with the high-concentration impurity region 4 is formed. As described above, the thickness of the titanium silicide layer in the gate electrode 7 is greater than the thickness of the reaction layer formed of an alloy of titanium, silicon and carbon in the ohmic electrode.

Next, as shown in FIG. 11(i), a silicon oxide layer having a thickness of about 1 μm is deposited as the second interlayer insulating layer 10 for covering the ohmic electrode 9 and the gate electrode 7. A contact hole passing through the second interlayer insulating layer 10 to reach the ohmic electrode 9 is formed by RIE or the like. Then, an aluminum film having a thickness of about 3 μm is deposited on the second interlayer insulating layer 10 and in the contact hole by vacuum vapor deposition or the like, and patterned by general photolithography and etching. Thus, the pad electrode 11 electrically connected with the ohmic electrode 9 is formed. Then, stacked layers formed of one, or a plurality of, titanium, nickel, gold, silver, platinum and the like are deposited by vacuum vapor deposition or the like to form the ohmic electrode 12 acting as the drain electrode.

By the above-described steps, the double implantation MISFET is completed. The produced MISFET had the following characteristics.

Channel mobility: 30 cm$^2$/Vsec or higher (Vds=1 V)
OFF withstand voltage: 1400 V
On resistance: 10 mΩ·cm$^2$ or lower
Contact resistance of the ohmic electrode (source electrode): $5 \times 10^{-5}$ Ω cm$^2$
Resistance of the gate electrode: 8 Ω/□
Measurement conditions: gate voltage: 20 V; drain voltage: 1 V.

As described above, by forming an ohmic electrode including a reaction layer formed of an alloy of titanium, silicon and carbon, graphite was prevented from being deposited during the formation of ohmic contact. This realized a contact resistance of the order of $10^{-5}$ Ωcm$^2$ and decreased the ON resistance. The formation of the gate electrode including the titanium silicide layer decreased the gate resistance and thus decreased the gate delay.

In the above embodiment, the titanium layer 15 is patterned to selectively form the titanium 15 in a part in which the ohmic electrode 9 is to be formed and in a part in which the gate electrode 7 is to be formed. This patterning process may be omitted by using the reactivity difference between the titanium-silicon-carbon alloy and titanium and the reactivity difference between titanium silicide and titanium.

Now, with reference to FIG. 12(*a*) through FIG. 12(*i*), a method for producing a semiconductor device including the step of forming the ohmic electrode 9 and the gate electrode 7 without patterning the titanium layer 15 will be described.

Figure 12:
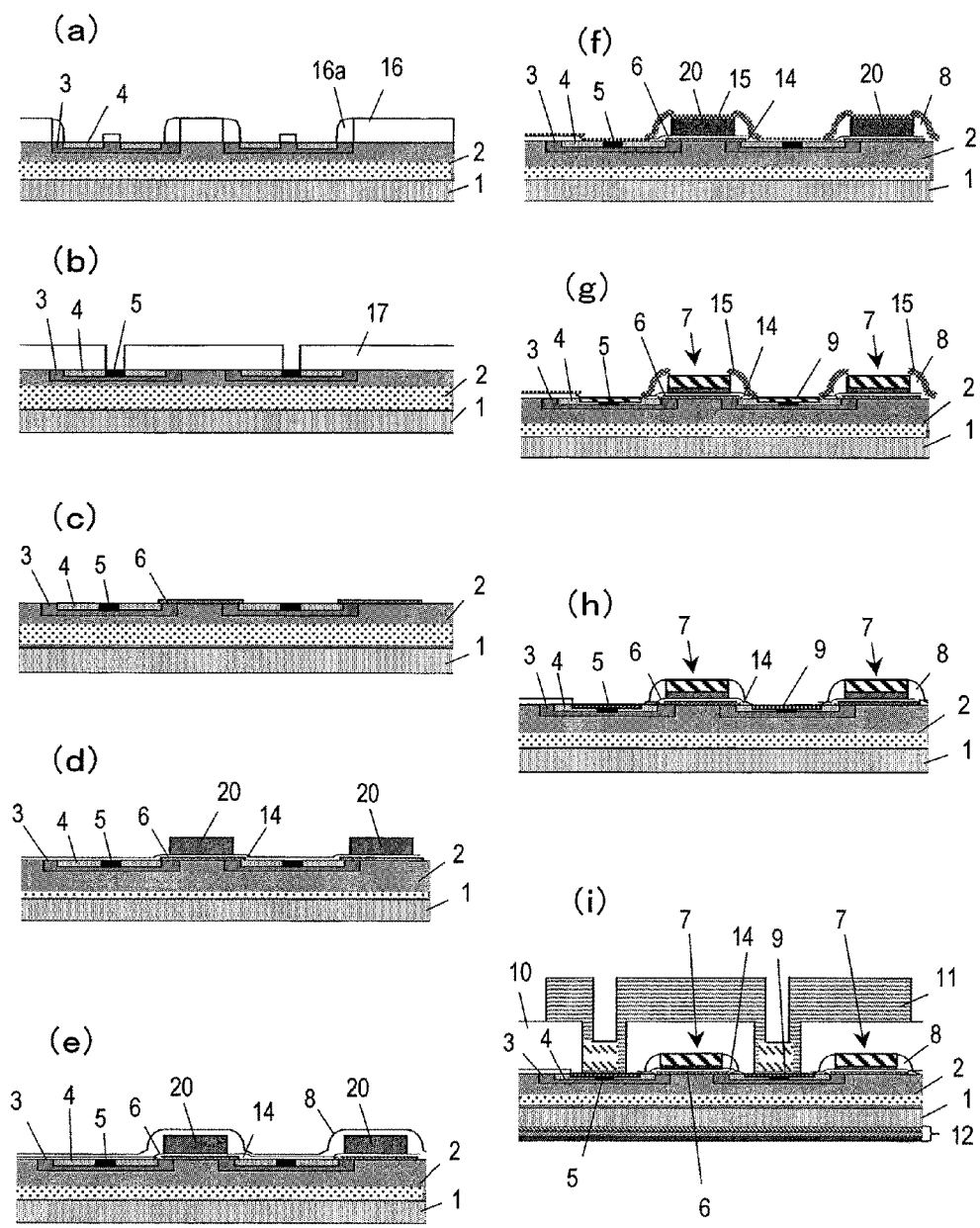
FIGS. 12(a) through 12(i) are cross-sectional views showing structures of the semiconductor device shown in FIG. 1 while being produced by a different production method.
Figure 13:
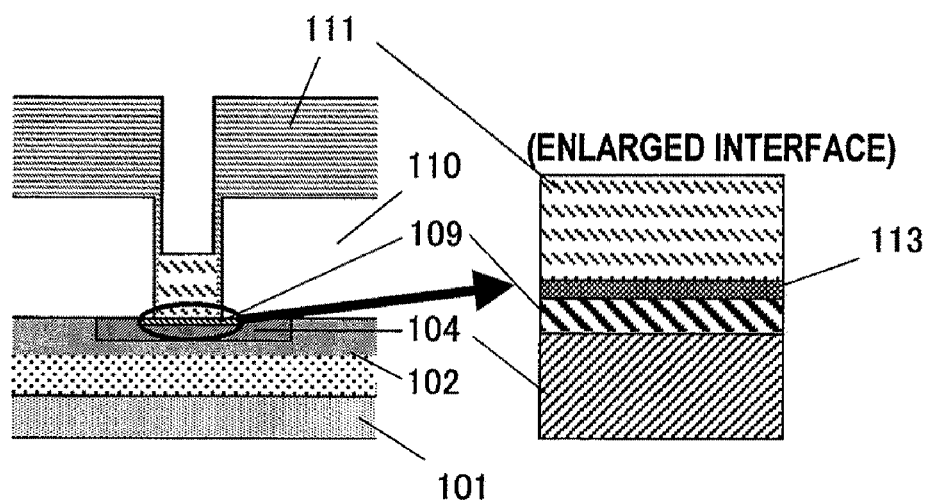
FIG. 13 is a cross-sectional view showing a structure of a conventional semiconductor device.

First, in the same manner as in the steps described above with reference to FIG. 11(*a*) through FIG. 11(*f*), the structure shown in FIG. 12(*a*) through FIG. 12(*f*) are produced. As a result, the structure shown in FIG. 12(*f*) is obtained. The structure shown in FIG. 12(*f*) includes the first interlayer insulating layer 8, a part from which the first interlayer insulating layer 8 has been removed and in which the ohmic electrode is to be formed, and the titanium layer 15 deposited on the top surface of the polysilicon layer 20.

As shown in FIG. 12(*g*), thermal treatment is performed at 850° C. for 1 minute or longer in an inert gas atmosphere of nitrogen, argon or the like. As a result of this thermal treatment, in the part from which the first interlayer insulating layer 8 has been removed and in which the ohmic electrode is to be formed and on the top surface of the polysilicon layer 20, the titanium layer 15 selectively reacts with silicon carbide in the high-concentration impurity region 4 and with the polysilicon layer 20 to form an alloy layer of titanium, silicon and carbon. In this process, silicon in the silicon oxide contained in the first interlayer insulating layer 8 is strongly bonded with oxygen. Therefore, silicon in the first interlayer insulating layer 8 and the titanium layer 15 do not substantially react with each other.

As a result of the thermal treatment, as shown in FIG. 1(*b*), most of the polysilicon layer 20 is silicided to form the low-resistance gate electrode 7. Also as a result of the thermal treatment, as shown in FIG. 1(*c*), the ohmic electrode 9 in ohmic contact with the high-concentration impurity region 4 is formed. As described above, the thickness of the titanium silicide layer in the gate electrode 7 is larger than the thickness of the reaction layer in the ohmic electrode. By contrast, on the first interlayer insulating layer 8, the titanium layer 15 remains without being reacted.

Next, as shown in FIG. 12(*h*), the titanium layer 15 remaining on the first interlayer insulating layer 8 without forming silicide is selectively removed by wet etching using a phosphoric acid-based etchant containing an aqueous solution of hydrogen peroxide. Owing to this, an unnecessary part of the titanium layer 15 is removed, and the gate electrode 7 and the ohmic electrode 9 are formed.

Then, in substantially the same manner as described above with reference to FIG. 11(*i*), the MISFET structure is completed (FIG. 12(*i*)).

As described above, according to the production method shown in FIG. 12(*a*) through FIG. 12(*i*), the titanium layer 15 does not need to be patterned. This can reduce the number of production steps, the production cost and the time required for the production.

In this embodiment, the gate insulating layer is a thermally oxidized layer. Alternatively, a gate insulating layer formed in other methods may be used. For example, a silicon oxide layer deposited by CVD or the like may be used as the gate insulating layer. Alternatively, the gate insulating layer may have a stacking structure of a thermally oxidized layer and a deposited layer. The gate insulating layer does not need to be a silicon oxide layer, and may be a metal oxide layer such as a silicon nitride layer, a silicon oxynitride layer, a tantalum oxide layer, a hafnium oxide layer or the like.

The semiconductor device in this embodiment includes the channel layer provided by epitaxial growth. As is clear from the above description, the effect of the present invention does not rely on the position or structure of the channel layer. Accordingly, the present invention can be embodied as a semiconductor device in which any of various channel structures is combined with the ohmic electrode and the gate electrode described above. For example, the present invention is preferably applicable to a MISFET using, as a channel region, an inversion layer formed on a surface portion of the silicon carbide layer 2 in the p-well region 3 by a voltage applied to the gate electrode 7 instead of using the channel layer 6 shown in FIG. 1(*b*).

In the above embodiment, an ohmic electrode including an alloy layer of titanium, silicon and carbon is used as the n-type ohmic electrode. Even where an ohmic electrode including a titanium reaction layer is used as the p-type ohmic electrode, the effect of preventing graphite from being deposited can be provided. The present invention is also preferably applicable to semiconductor devices in which the silicon carbide substrate, the semiconductor layers and the semiconductor regions have opposite conductivity types to those of the above-described embodiment.

INDUSTRIAL APPLICABILITY

The present invention is preferably usable for a silicon carbide semiconductor device, and especially to a silicon carbide semiconductor device for power devices.

The invention claimed is:

1. A semiconductor device, comprising:
a silicon carbide semiconductor substrate including a silicon carbide layer;
a high-concentration impurity region provided in the silicon carbide layer;
an ohmic electrode electrically connected with the high-concentration impurity region;
a channel region being in direct contact with the high-concentration impurity region;
a gate insulating layer provided on the channel region; and
a gate electrode provided on the gate insulating layer;
wherein the ohmic electrode contains an alloy of titanium, silicon and carbon, and the gate electrode contains titanium silicide,
wherein the ohmic electrode includes a reaction layer formed of the alloy of titanium, silicon and carbon; and
the reaction layer in the ohmic electrode is in direct contact with the high-concentration impurity region.

2. The semiconductor device of claim 1, wherein the high-concentration impurity region is doped with an n-type impurity at a high concentration.

3. The semiconductor device of claim 2, wherein the gate electrode contains a titanium silicide layer.

4. The semiconductor device of claim 3, wherein the reaction layer in the ohmic electrode and the titanium silicide layer in the gate electrode have difference thicknesses.

5. The semiconductor device of claim 4, wherein the thickness of the reaction layer in the ohmic electrode is smaller than the thickness of the titanium silicide layer in the gate electrode.

6. The semiconductor device of claim 5, wherein the ohmic electrode further includes a titanium nitride layer.

7. The semiconductor device of claim 6, wherein in the ohmic electrode, the titanium nitride layer has a larger thickness than the thickness of the reaction layer.

8. The semiconductor device of claim 6, wherein the gate electrode further includes a polysilicon layer.

9. The semiconductor device of claim 8, wherein in the gate electrode, the polysilicon layer has a smaller thickness than the thickness of the titanium silicide layer.

10. The semiconductor device of claim 9, wherein the polysilicon layer in the gate electrode is in contact with the gate insulating layer.

11. The semiconductor device of claim 2, wherein in the ohmic electrode, the carbon has a high concentration in a portion close to the high-concentration impurity region and has a low concentration in a surface portion of the ohmic electrode.

12. The semiconductor device of claim 11, wherein the carbon has a concentration of 5 atom % or lower at a position of the ohmic electrode closest to the surface thereof.

13. The semiconductor device of claim 2, further comprising a channel layer provided in a part of a surface portion of the silicon carbide layer so as to be in contact with the high-concentration impurity region, wherein the channel region is located in the channel layer.

14. The semiconductor device of claim 2, wherein:
the silicon carbide layer includes a well region doped with a p-type impurity and provided so as to surround the high-concentration impurity region; and
the channel region is located in a surface portion of the well region so as to be in contact with a part of the surface of the silicon carbide layer and also so as to connect the high-concentration impurity region and a part of the silicon carbide layer in which the well region is not formed.

15. The semiconductor device of claim 1, further comprising another ohmic electrode provided on an surface of the semiconductor substrate which is opposite to the surface on which the silicon carbide layer is provided.

* * * * *

UNITED STATES PATENT AND TRADEMARK OFFICE
CERTIFICATE OF CORRECTION

PATENT NO.         : 8,076,736 B2
APPLICATION NO.    : 12/518124
DATED              : December 13, 2011
INVENTOR(S)        : Masashi Hayashi et al.

Page 1 of 1

It is certified that error appears in the above-identified patent and that said Letters Patent is hereby corrected as shown below:

Title Page, the Assistant Examiner, "Tran Tran" should read -- Trang Tran --.

Signed and Sealed this
Nineteenth Day of June, 2012

David J. Kappos
*Director of the United States Patent and Trademark Office*